US005325266A

United States Patent [19]

Lim

[11] Patent Number: 5,325,266

[45] Date of Patent: Jun. 28, 1994

[54] COOLING DEVICE FOR A MEGNETRON

[76] Inventor: Jong H. Lim, 1429-18 Sankyeok 3ku, Buk-ku, Daeku-si, Rep. of Korea

[21] Appl. No.: 865,125

[22] Filed: Apr. 8, 1992

[30] Foreign Application Priority Data

May 3, 1991 [KR] Rep. of Korea ................ 6304/1991

[51] Int. Cl.[5] ............................................ H05K 7/20

[52] U.S. Cl. .................................. 361/704; 361/690; 165/80.3; 165/179; 165/182; 174/16.3

[58] Field of Search ...................... 165/80.3, 179, 182, 165/185; 174/16.3; 361/383-384, 386-389, 392, 394

[56] References Cited

U.S. PATENT DOCUMENTS 3,213,324 10/1965 McAdams .......................... 361/388
3,327,779 6/1967 Jacoby .............................. 361/388
4,103,737 8/1978 Perkins .............................. 361/386
4,948,953 8/1990 Starck ............................... 361/388
5,130,918 7/1992 Schuster ............................ 361/388

*Primary Examiner*—Gregory D. Thompson
*Attorney, Agent, or Firm*—Fish & Richardson

[57] ABSTRACT

Cooling device of a magnetron for a microwave oven, which includes a plurality of radiation fins disposed between an outer periphery of an anode cylinder and an inner surface of a yoke serving as a frame for radiating heat of a high temperature produced during osicillating operation of the magnetron for generating an electromagnetic wave. The temperature of the fins disposed centrally in substantially the same as the temperature of the fins disposed at both ends of the anode cylinder. This is accomplished by, the fins disposed centrally on the outer peripherey being arranged at a diffeent distance from the distance between the fins disposed on both ends of the anode cylinder or by the fins disposed centrally being made of different materials from the materials of the end.

3 Claims, 2 Drawing Sheets

COOLING DEVICE FOR A MEGNETRON

BACKGROUND OF THE INVENTION

1. Field of the Invention

This invention relates to a cooling device of a magnetron, which is used in a microwave oven to radiate heat of a high temperature produced during oscillating operation of the magnetron for generating an electromagnetic wave.

2. Description of the Prior Art

Generally, a magnetron for generating a microwave is, as shown in FIG. 1 of the accompanying drawings, a kind of a diode comprising an anode cylinder (referred to as an anode) 1 having a plurality of radially extending vanes 1*a* mounted on its inner periphery, and a direct-heated filament (referred to as a cathode) 2 disposed axially in centered relation within a yoke 11 serving as a frame and surrounded by the anode cylinder. In addition, the magnetron comprises a magnetic circuit section including an annular permanent magnet 4 and a magnetic pole 5. The magnetic circuit section applies magnetic flux into an active space S defined between the anode and the cathode. The magnetron also includes an output section including an antenna lead 6, an antenna seal 7, an antenna ceramics 8 and an antenna cap 9. The output section emits microwave energy transferred to the anode cylinder 1 to a cavity of a microwave oven, i.e., the exterior of the magnetron, through a waveguide (not shown). The magnetron includes a radiation section including a plurality of radiation fins 3 disposed in parallel. The radiation fins are equally spaced-apart in relation to each other and are located between the outer periphery of the anode cylinder 1 and the inner peripherey of the yoke 11 to radiate heat of a high temperature generated during oscillating operation of the magnetron. The magnetron includes a filter circuit for preventing an unnecessary component of the microwave produced in the active space between the anode cyliner 1 and the filament 2 from back-flowing to a power source.

In the magnetron thus constructed, when the filament 2 is energized, thermions are emitted from the filament into the active space S. The thermions effect a cycloidal movement as they are subjected to the force of an electric field induced between the vanes 1*a* and the filament 2 and the magnetic flux applied into the active space S by the magnetic pole 5 of the magnetic circuit section. As a result, the accelerated thermions generate the microwave energy which will be received by the vanes 1*a*. The microwave energy transferred to the vanes is then emitted through the antenna lead 6 of the output section into the cavity of the microwave oven via the waveguide. At this time, heat of a high temperature is generated as the thermions with the energy applied by the electric field impinge against the vanes of the anode cylinder. In order to radiate the heat to the outside, therefore, it is necessarily required to dispose a plurality of radiation fins 3 on the outer periphery of the anode cylinder 1.

As shown in FIG. 1, each of the radiation fins 3*a* is secured at its one end to the outer periphery of the anode cylinder 1 and is brought at its opposite end into engagement with the inner surface of the yoke 11, thereby radiating the heat of a high temperature generated due to collision of the theremions with the vanes. In order to provide a path for radiating the heat, the conventional radiation fins are made of aluminum or alloys thereof and disposed in parallel, equally spaced relation to each other, as shown in FIG. 2.

Describing the prior art in more detail the outer surface of the anode cylinder 1 with a height H permits a plurality of the radiation fins 3 to be disposed thereon in parallel, vertically spaced-apart relation to each other. When the design height H is approximately 26 mm, each fin has a thickness t of approximately 0.6 mm, and a total of 4 to 7 fins are disposed at equal distances apart in the range of about 3.5 to 6 mm.

In the cooling device of the prior art comprising the equally spaced radiation fins, when the heat of a high temperature is generated due to collision of the thermions with the vanes, the radiation fins secured to the outer surface of the central portion of the anode cylinder (having the vanes mounted on its inner periphery) have a temperature of about 10°~30° C.; higher than the temperature of the fins disposed on both ends of the sides of the anode cylinder. There is a difference in temperature between the different fins disposed axially on the anode cylinder. Therefore, when the magnetron is continuously operated for a long time, the fins disposed centrally on the outer peripherey of the anode cylinder tend to be deformed by the heat of a higher temperature transferred continually to them. As a result, the magnetron of the prior art may undergo a degrading of an operating characteristic, resulting in defective operation due to an abnormal temperature rise.

SUMMARY OF THE INVENTION

In view of the aforesaid problem of the prior art, it is an object of the present invention to provide a cooling device of a magnetron, which is capable of compensating for a difference in temperature between radiation fins caused by heat of a high temperature generated during oscillation of the magnetron, so that all of the fins have a substantially uniform temperature irrespective of their positions.

To achieve the above object, there is provided according to one embodiment of the present invention a cooling device of a magnetron for radiating heat of a high temperature generated by thermions in the magnetron wherein the device comprises an anode cylinder having radially extending vanes mounted on its inner periphery and a plurality of radiation fins disposed in parallel, axially spaced-apart relation to each on the outer periphery of the anode cylinder in such a manner that the fins disposed centrally on the outer periphery have substantially the same temperature as the temperature of the fins disposed on both ends of the side of the anode cylinder.

According to another embodiment of the present invention, there is provided a cooling device of a magnetron comprising an anode cylinder having radially extending vanes mounted on its inner periphery and a plurality of radiation fins disposed in parallel, axially spaced-apart relation to each other on the outer periphery of the anode cylinder, wherein the fins disposed centrally on the outer periphery are made of materials having different thermal conductivity from the thermal conductivity of the fins disposed on both ends of the side of the anode cylinder.

DESCRIPTION OF THE PREFERRED EMBODIMENT

The present invention will now be described in detail, by way of example, with reference to FIGS. 3 and 4 of the accompanying drawings.

Figure 1:
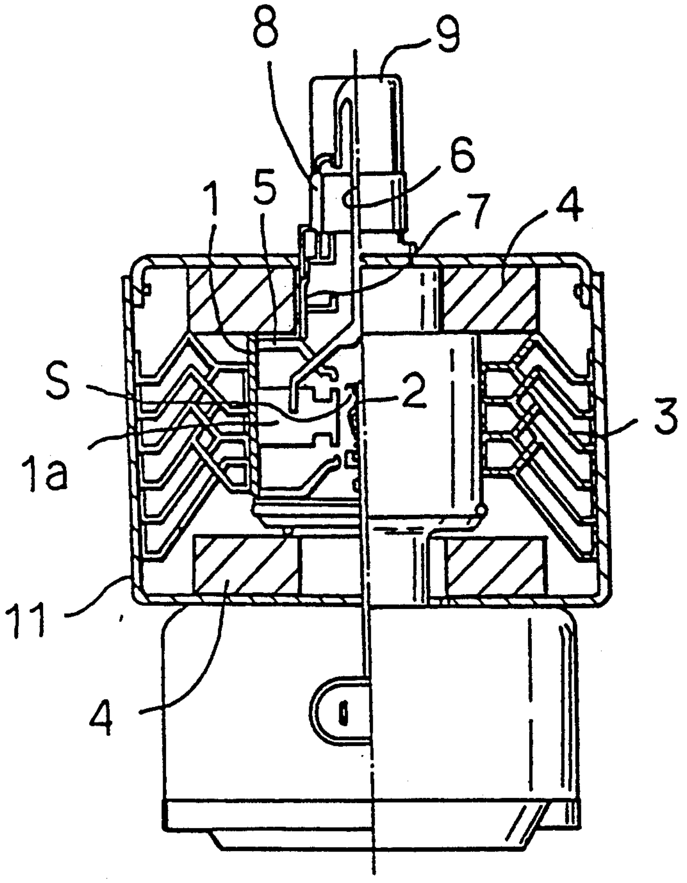
F I G.1 PRIOR ART
FIG. 1 is a cross-sectional view of a typical magnetron for a microwave oven.
Figure 2:
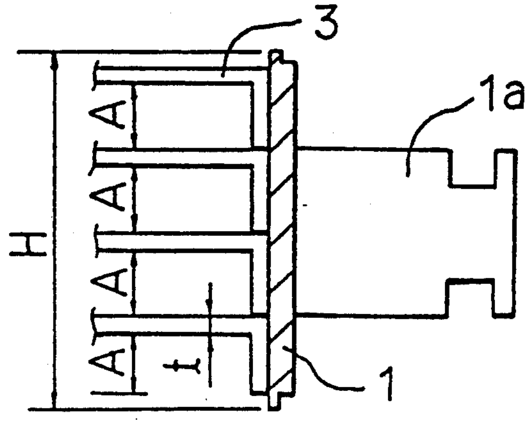
F I G.2 PRIOR ART
FIG. 2 is a cross-sectional view showing a cooling device of a magnetron according to the prior art.
Figure 3:
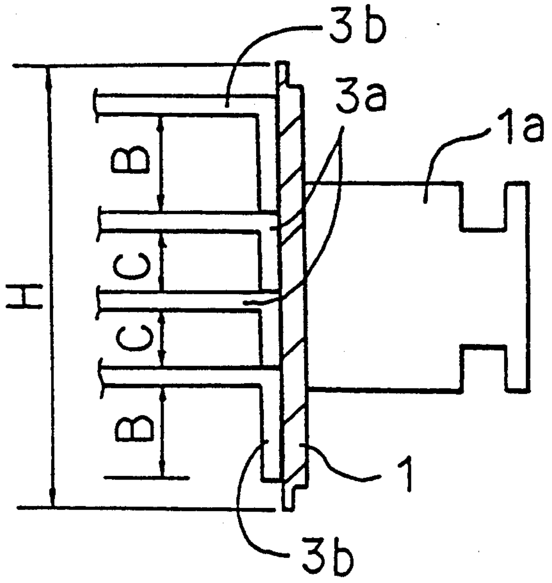
FIG. 3 is a cross-sectional view showing a cooling device of a magnetron according to one embodiment of the present invention.

Referring to FIG. 3 showing a cooling device of a magnetron according to one embodiment of the present invention, the general construction and operation of the magnetron is the same as those in the prior art with the exception of arrangement of the structure of the radiation fins. Throughout the following detailed description similar reference numerals refer to similar elements in all figures of the drawings and the description of the general construction of the magnetron is omitted herein to avoid the duplication of explanation.

According to a preferred embodiment of the present invention, a plurality of the radiation fins 3 each having a horizontally extending portion and a bent portion of an approximately l-shape in which the bent portion is integral with the horizontal portion, are disposed in parallel, spaced-apart relation to each other on the outer periphery of an anode cylinder 1. Further, the fins 3*a* attached to the outer periphery of the central portion of the anode cylinder have a distance therebetween less than the distance between the fins 3*b* disposed on both ends of the side of the anode cylinder. According to one example of a design, a required height H of the outer periphereal surface of the anode cylinder 1 permitting the radiation fins 3 to be disposed thereon in parallel, spaced relation to each other may be expressed by the following equation (provided that the conditions): $H \approx 26$ mm, $t=0.6$ mm, $f=4 \sim 7$, $A=3.5 \sim 6$ mm, $L<12$ mm, and $C/B=60 \sim 80\%$ are fulfilled:

$$H \approx f \times L + f \times t \quad \text{(I)}$$

Where, H is an overall height of the outer surface of the anode cylinder permitting the radiation fins to be mounted thereon, f is the number of the radiation fins, L is a distance between the radiation fins (an equal distance: A, and different distances: B and C), and t is a thickness of each radiation fin.

For example, assuming that 4 radiation fins are disposed on the outer periphery of the anode cylinder, i.e., the value of f is 4, in the case where the fins are disposed at equal distances A as in the prior art. The value of A obtained from Equation I is about 6 mm. In case where the fins are disposed such that the centrally disposed fins have a distance therebetween less than the distance between the side fins as shown in FIG. 3 showing one embodiment of the present invention the spacing of the fins is determined by, the equation, $H \approx 2(B+C) \approx 24$ mm (if the thickness t of the fin is disregarded) and is derived from Equation I. According to one example of the design: $L<12$ mm, and $C/B=60 \sim 80\%$. For example, if 5 mm is chosen as the value of C, the value of B is 7 mm, while, when the value of C is 4.5 mm, the value of B is 7.5 mm. Besides the above relationships, various combinations of the values of B and C an also be made.

As described above, according to the present invention, since the centrally located radiation fins 3*a* are arranged to have a distance therebetween less than the distance between the side fins 3*b*, the area of the radiating surface of the central portion becomes larger than that of the side portions, thereby providing faster radiation of heat than the side portions. As a result, the arrangement is capable of avoiding a difference in temperature between the central and side fins so that all of the fins have a substantially uniform temperature.

Figure 4:
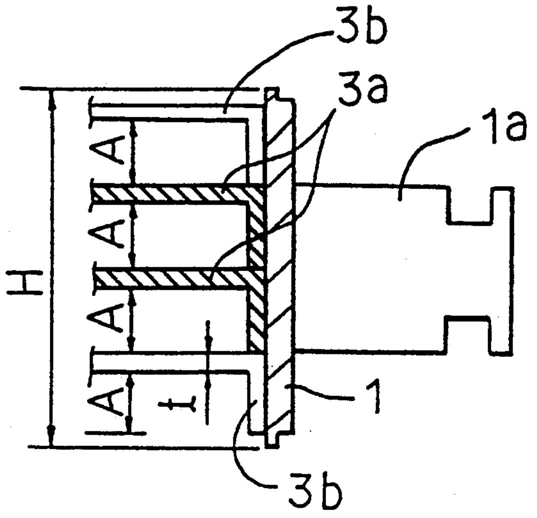
FIG. 4 is a cross-sectional view showing a cooling device of a magnetron according to another embodiment of the present invention.

Referring now to FIG. 4 showing another embodiment of the present invention, which is different from the previous embodiment, the cooling device of the magnetron according to this embodiment comprises the radiation fins 3*a* and 3*b* which are disposed in parallel, equally spaced-apart relation to each other on the outer peripherey of the anode cylinder 1, as in the prior art. In this embodiment the centrally located fins 3*a* are made of copper having a heat transfer rate of 0.74 $cal/cm^2$. sec. °C., rather than aluminum having a heat transfer rate of 0.53 $cal/cm^2$. sec. °C. as used in the prior art. The fins on the end of the anode cylinder are still made of aluminum. As a result, the cooling device of this embodiment compensates for a difference in temperature between the central and side fins by a difference in heat transfer rate between the materials.

As set forth above, the present invention provides advantages over the prior art since the radiation fins disposed on the outer periphery of the anode cylinder for radiating the heat of a high temperature generated due to collision of the thermions with the vanes disposed on the inner periphery of the anode cylinder are arranged to redistribute the temperature. The fins disposed centrally on the cuter periphery of the anode cylinder have a narrower distance therebetween, the fins disposed on both ends of the side of the anode cylinder are spaced a wider therefore, the area of the radiating surface of the central portion is larger than that of the side protions to provide a higher efficiency of radiation of heat, resulting in compensating for a temperature difference along the height of the outer periphery of the anode cylinder. In addition, according to the present invention, the centrally located fins may be made of materials having a heat transfer rate higher than that of the materials of the side fins, so that a temperature difference between the fins can be compensated for by a difference in heat transfer rate between the materials. As a result, even when the magnetron is continuously operated for a long time, the fins do not undergo deformation by the heat of a higher temperature transferred to them, resulting in eliminating a cause of defective operation of the magnetron and enhancing the reliability and the quality of the product.

While the invention has been shown and described with reference to preferred embodiments thereof, it will be understood that variations and modifications in detail may be made therein without departing form the spirit and scope of the invention as defined in the appended claims.

What is claimed is:

1. A cooling device of a magnetron for radiating heat of a high temperature generated by thermions in the magnetron, the device comprising:

an anode cylinder having radially extending vanes mounted on its inner periphery;

a plurality of radiation fins disposed in parallel, axially spaced-apart relation to each other on the outer periphery of said anode cylinder, wherein the plurality of said radiation fins are arranged such that the fins disposed centrally on said outer periphery have a distance therebetween less than the distance between the fins disposed on both ends of said outer periphery, and such distances are such that the fins disposed centrally on said outer periphery have substantially the same temperature as the temperature of the fins disposed on both ends of the outer periphery of said anode cylinder.

2. A cooling device of a magnetron as claimed in claim 1, wherein said distance between said fins disposed centrally on said outer periphery is 60~80% of said distance between said fins disposed on said both end sides.

3. A cooling device of a magnetron for radiating heat of a high temperature generated by thermions in the magnetron, the device comprising:

an anode cylinder having radially extending vanes mounted on its inner periphery; and a plurality of radiation fins disposed in parallel, axially spaced-apart relation to each other on the outer periphery of said anode cylinder, wherein the fins disposed centrally on said outer periphery are made of materials having different thermal conductivity from the thermal conductivity of the materials of the fins disposed on both ends of the side of said anode cylinder and wherein the fins disposed centrally on said outer periphery are made of copper and the fins disposed on said both ends of the side are made of aluminum.

* * * * *